(12) United States Patent
Naono et al.

(10) Patent No.: US 10,020,443 B2
(45) Date of Patent: Jul. 10, 2018

(54) METHOD OF PRODUCING LAMINATED THIN FILM STRUCTURE, LAMINATED THIN FILM STRUCTURE, AND PIEZOELECTRIC ELEMENT INCLUDING SAME

(71) Applicant: FUJIFILM Corporation, Tokyo (JP)

(72) Inventors: Takayuki Naono, Kanagawa (JP); Takahiro Sano, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/846,272

(22) Filed: Dec. 19, 2017

(65) Prior Publication Data
US 2018/0108829 A1 Apr. 19, 2018

Related U.S. Application Data

(63) Continuation of application No. PCT/JP2016/003039, filed on Jun. 23, 2016.

(30) Foreign Application Priority Data

Jul. 2, 2015 (JP) .................................. 2015-133333

(51) Int. Cl.
*H01L 41/187* (2006.01)
*H01L 41/312* (2013.01)
(Continued)

(52) U.S. Cl.
CPC ........ *H01L 41/312* (2013.01); *H01L 41/0471* (2013.01); *H01L 41/0805* (2013.01);
(Continued)

(58) Field of Classification Search
CPC ............ H01L 41/1875; H01L 41/1876; H01L 41/044; H01L 41/107; H01L 41/312; H01L 41/0471; H03H 9/02031
(Continued)

(56) References Cited

U.S. PATENT DOCUMENTS

2002/0149296 A1* 10/2002 Fujii .................... B41J 2/14233
310/328
2004/0135183 A1* 7/2004 Matsuura .......... H01L 27/11502
257/295
(Continued)

FOREIGN PATENT DOCUMENTS

DE 60000948 T2 7/2003
JP H11-108951 A 4/1999
(Continued)

OTHER PUBLICATIONS

Takamichi Fujii et al., Characterization of Nb-doped Pb(Zr,Ti)O3 films deposited on stainless steel and silicon substrates by RF-magnetron sputtering for MEMS applications, Sensors and Actuators A: Physical, Aug. 2010, vol. 163, pp. 220-225, Elsevier.
(Continued)

*Primary Examiner* — Bryan Gordon
(74) *Attorney, Agent, or Firm* — Studebaker & Brackett PC

(57) ABSTRACT

A first lamination step of forming lower electrode films on both surfaces of a diaphragm and directly forming a first Pb-containing perovskite oxide film which has a larger thermal expansion coefficient than that of the diaphragm and has a columnar structure on a front surface of the lower electrode film; and a second lamination step of directly forming a second Pb-containing perovskite oxide film on a front surface of the lower electrode film are sequentially performed. The second Pb-containing perovskite oxide film is formed under a condition that a difference between a molar ratio $R_{A1}$ of Pb to a B-site element in the first Pb-containing perovskite oxide film and a molar ratio $R_{B1}$ of Pb to a B-site element in the second Pb-containing perovskite oxide film after the second lamination step is 0.056 or less.

8 Claims, 4 Drawing Sheets

(51) Int. Cl.
  *H01L 41/09*   (2006.01)
  *H01L 41/316*  (2013.01)
  *H01L 41/08*   (2006.01)
  *H01L 41/047*  (2006.01)

(52) U.S. Cl.
  CPC ........ *H01L 41/094* (2013.01); *H01L 41/1875* (2013.01); *H01L 41/316* (2013.01)

(58) Field of Classification Search
  USPC .................................................. 310/358, 359
  See application file for complete search history.

(56) References Cited

U.S. PATENT DOCUMENTS

| | | | |
|---|---|---|---|
| 2007/0024162 A1* | 2/2007 | Shibata | C04B 35/495 310/358 |
| 2008/0213575 A1* | 9/2008 | Shimizu | B41J 2/14233 428/332 |
| 2011/0121096 A1 | 5/2011 | Nihei et al. | |
| 2016/0240768 A1* | 8/2016 | Fujii | H01L 41/0471 |

FOREIGN PATENT DOCUMENTS

| | | |
|---|---|---|
| JP | 2000-332313 A | 11/2000 |
| JP | 2002-339058 A | 11/2002 |
| JP | 2010-034448 A | 2/2010 |
| JP | 2015-088521 A | 5/2015 |

OTHER PUBLICATIONS

An Office Action issued by the German Patent Office dated Jan. 30, 2018, which corresponds to German Patent Application 112016002558.0 and is related to U.S. Appl. No. 15/846,272.

International Search Report issued in PCT/JP2016/003039; dated Sep. 20, 2016.

Written Opinion issued in PCT/JP2016/003039; dated Sep. 20, 2016.

Ishikawa et al.; Lead Zirconate Titanate Thick Film Fabricated by the Hydrothermal Synthesis Method; Material Technology; 2004; pp. 11-18; vol. 22.

Fujii et al.: Characterization of Nb-doped $Pb(Zr,Ti)O_3$ films deposited on stainless steel and silicon substrates by RF-magnetron sputtering for MEMS applications; Sensors and Actuators A 163; 2010; pp. 220-225.

Kanno et al.: Measurement of transverse piezoelectric properties of PZT thin films; Sensors and Actuators A 107; 2003; pp. 68-74.

Calame et al.; Growth and properties of gradient free sol-gel lead zirconate titanate thin films; Applied Physics Letters 90; 062907; 2007; pp. 062907-1 to 062907-3.

\* cited by examiner

METHOD OF PRODUCING LAMINATED THIN FILM STRUCTURE, LAMINATED THIN FILM STRUCTURE, AND PIEZOELECTRIC ELEMENT INCLUDING SAME

CROSS-REFERENCE TO RELATED APPLICATIONS

This application is a continuation application of International Application No. PCT/JP2016/003039 filed Jun. 23, 2016, which claims priority under 35 U.S.C. § 119(a) to Japanese Patent Application No. 2015-133333, filed Jul. 2, 2015. Each of the above applications is hereby expressly incorporated by reference, in its entirety, into the present application.

BACKGROUND OF THE INVENTION

1. Field of the Invention

The present invention relates to a laminated thin film structure obtained by forming a columnar structure film on both surfaces of a diaphragm, a method of producing the same, and a piezoelectric element including the same.

2. Description of the Related Art

A device that uses a piezoelectric body exhibiting a positive piezoelectric effect and an inverse piezoelectric effect has a simpler structure than that of a device having another drive system and can be used for an actuator or a sensor. Since a piezoelectric actuator is excellent than another system from the viewpoints of high precision and a high torque and a piezoelectric sensor is excellent than another system from the viewpoint of a simple circuit, the piezoelectric actuator and the piezoelectric sensor are used for various applications.

Particularly, in a case where a piezoelectric thin film obtained by directly forming a piezoelectric material on a substrate is used, piezoelectric micro electro mechanical systems (MEMS) device having a size of several millimeters can be realized by microfabrication. In conventional MEMS, it is common to use a unimorph actuator obtained by forming a piezoelectric thin film on one surface of a diaphragm formed of a non-piezoelectric body such as Si. In a unimorph actuator, in a case where a piezoelectric thin film integrally formed on one surface of a diaphragm expands and contracts, the diaphragm is deflected and displaced and then vertically displaced so that the unimorph actuator drives (FIG. 5A). However, in some applications, there has been a demand for a further actuator displacement and thus it has not been possible to deal with the demand with the conventional unimorph actuator.

In applications for which a larger actuator displacement is required, it is effective to use a bimorph structure obtained by forming piezoelectric thin films on both surfaces of a diaphragm. In the bimorph structure, it is possible to obtain a displacement approximately twice the displacement of the unimorph structure due to expansion and contraction of the piezoelectric thin films formed on both surfaces of the diaphragm in opposite directions to each other (FIG. 5B). A piezoelectric body tries to be contracted in the plane of the diaphragm due to a piezoelectric transversal effect ($d_{31}$ mode) in a case where an electric field in the same direction as the polarization direction of the piezoelectric body is applied. In a case where the piezoelectric body film formed on the diaphragm is contracted in the plane of the diaphragm, since the diaphragm restricts the deformation, the diaphragm is deflected (bent) and deformed in the thickness direction.

As a method of incorporating a bimorph structure in the piezoelectric MEMS, a method of forming piezoelectric thin films on both surfaces of a substrate which becomes a diaphragm (hereinafter, referred to as a diaphragm) and processing the diaphragm into a desired shape is disclosed (JP1999-108951A (JP-H11-108951A) and JP2000-332313A). JP1999-108951A (JP-H11-108951A) discloses a method of forming lead zirconate titanate (hereinafter, abbreviated as PZT thin films serving as a piezoelectric body on both surfaces of a diaphragm at once according to a hydrothermal synthesis method. Since films having the same characteristics can be formed at the same time, this method is excellent in temperature characteristics of a device and commonization of drive waveforms. However, since the PZT thin film formed according to a hydrothermal synthesis method has a porous structure so that the density thereof is low and a piezoelectric constant $d_{31}$ is 21 pm/V, which is small, a high displacement cannot be extracted (Material Technology vol. 22 (2004) pp. 11 to 18).

It has been known that a Pb-containing perovskite oxide film such as a dense PZT thin film having a high piezoelectric constant has a columnar film structure and is formed by a sol-gel method or a sputtering method (JP2000-332313A, Sensors and Actuators A 163 (2010) pp. 220 to 225, Sensors and Actuators A 107 (2003) pp. 68 to 74, and APPLIED PHYSICS LETTERS 90, (2007) 062907). In a case where the film formation is made using these methods, it is desired to form a film on each of both surfaces of a diaphragm at a film forming temperature of approximately 600° C. to 700° C. In order to sufficiently obtain piezoelectric characteristics.

SUMMARY OF THE INVENTION

However, in a case where a columnar structure film of a Pb-containing perovskite oxide is sequentially formed on both surfaces of a diaphragm having a smaller thermal expansion coefficient than that of a Pb-containing perovskite oxide film such as a Si substrate at a high film forming temperature to obtain a laminated thin film structure, the present inventors confirmed that cracks easily occur by a strong tensile stress being generated in the Pb-containing perovskite oxide film formed later during a slow cooling process performed on the Pb-containing perovskite oxide film formed later.

The present invention has been made in consideration of the above-described circumstances, and an object of the present invention is to provide a method of producing a laminated thin film structure which enables production of the structure without occurrence of cracks in a Pb-containing perovskite oxide film even in a case where a diaphragm having a smaller thermal expansion coefficient than that of the Pb-containing perovskite oxide film is used, in a method of producing a laminated thin film structure formed by sequentially forming a Pb-containing perovskite oxide film having a columnar structure on both surfaces of a diaphragm.

Another object of the present invention is to provide a laminated thin film structure which has excellent piezoelectric characteristics and includes a Pb-containing perovskite oxide film free from cracks; and a piezoelectric element which includes the same.

According to the present invention, there is provided a method of producing a laminated thin film structure which is formed to sequentially include, on a front surface of a diaphragm, a first lower electrode film and a first Pb-containing perovskite oxide film which has a larger thermal expansion coefficient than that of the diaphragm and is a columnar structure film extending in a film thickness direction from the front surface of the diaphragm and to sequentially include, on a rear surface of the diaphragm, a second lower electrode film and a second Pb-containing perovskite oxide film which is the columnar structure film and has the same film thickness as that of the first Pb-containing perovskite oxide film, the method sequentially comprising: a first lamination step of laminating the first Pb-containing perovskite oxide film on a front surface of the first lower electrode film through direct formation; and a second lamination step of laminating the second Pb-containing perovskite oxide film on a front surface of the second lower electrode film on direct formation, in which the second lamination step is performed by forming the second Pb-containing perovskite oxide film under a condition that a difference $|R_{A1}-R_{B1}|$ between a molar ratio $R_{A1}$ of Pb to a B-site element in the first Pb-containing perovskite oxide film and a molar ratio $R_{B1}$ of Pb to a B-site element in the second Pb-containing perovskite oxide film after the second lamination step is 0.056 or less.

In the method of producing a laminated thin film structure, the first Pb-containing perovskite oxide film and the second Pb-containing perovskite oxide film include one or two or more kinds of perovskites oxides which are formed of the same constituent elements and represented by Formula P1.

Further, according to the present invention, there is provided a laminated thin film structure of the present invention comprising: a diaphragm; a first lower electrode film which is formed on a front surface of the diaphragm; a first Pb-containing perovskite oxide film which is directly formed on a front surface of the first lower electrode film on the opposite side of the diaphragm and has a larger thermal expansion coefficient than that of the diaphragm; a second lower electrode film which is formed on a rear surface of the diaphragm; and a second Pb-containing perovskite oxide film which is directly formed on a front surface of the second lower electrode film on the opposite side of the diaphragm and has the same film thickness as that of the first Pb-containing perovskite oxide film, in which a difference $|R_{A1}-R_{B1}|$ between a molar ratio $R_{A1}$ of Pb to a B-site element in the first Pb-containing perovskite oxide film and a molar ratio $R_{B1}$ of Pb to a B-site element in the second Pb-containing perovskite oxide film is in a range of 0.019 to 0.056, spontaneous polarization axes of the first and second Pb-containing perovskite oxide films are preferentially oriented to (100) in orientations different from each other, and the first and second Pb-containing perovskite oxide films include one or two or more kinds of perovskites oxides which are formed of the same constituent elements and represented by Formula P1.

$$(Pb_xA_{a-x})B_bO_c \qquad P1:$$

(A represents an A-site element containing at least one element selected from the group consisting of Pb, Ba, Sr, Bi, Li, Na, Ca, Cd, Mg, K, and a lanthanide element, B represents a B-site element containing at least one element selected from the group consisting of Ti, Zr, V, Nb, Ta, Sb, Cr, Mo, W, Mn, Mg, Sc, Co, Cu, In, Sn, Ga, Zn, Cd, Fe, Ni, Hf, and Al, and x satisfies a relationship of "0<x≤a".)

It is preferable that the Pb-containing perovskite oxide films include one or two or more kinds of perovskite oxides represented by Formula P2. In Formula P2, it is preferable that M includes Nb and the molar ratio (Nb/(Zr+Ti+M)) of Nb to the B site is in a range of 0.10 to 0.20. It is more preferable that M represents Nb.

$$Pb_a(Zr_y,Ti_z,M_{b-y-z})O_c \qquad P2:$$

(M represents at least one B-site element selected from the group consisting of V, Nb, Ta, Sb, Cr, Mo, W, Mn, Mg, Sc, Co, Cu, In, Sn, Ga, Zn, Cd, Fe, Ni, Hf, and Al, y is greater than 0 and less than b, z is greater than 0 and less than b, and b−y−z is greater than or equal to 0.)

In the present specification, the expression "formed of the same constituent elements" is not limited to the perfect match and elements different from each other within a range in which a difference in thermal expansion coefficient between oxide films is within ±2.5 ppm/° C. (or ±2.5×10$^{-6}$/° C.) may be included. The thermal expansion coefficient of a perovskite oxide typically has a variation of approximately 4 to 9 ppm/° C. depending on the number of times of measurement, it is considered that the first and second Pb-containing perovskite oxide films in the present specification include such level of variations. Accordingly, an acceptable difference in thermal expansion coefficient between the first Pb-containing perovskite oxide film and the second Pb-containing perovskite oxide film is ±2.5 ppm/° C.

Further, in a case where the first Pb-containing perovskite oxide film and the second Pb-containing perovskite oxide film have the same film thickness, this means that a difference in average film thickness between both films is within ±10%. The average film thickness of the first Pb-containing perovskite oxide film and the second Pb-containing perovskite oxide film is set as a value measured using an interference thickness meter (measured by a film thickness measuring system (manufactured by Filmetrics Japan, Inc.)).

In the method of producing a laminated thin film structure and the laminated thin film structure of the present invention, it is preferable that the diaphragm is a silicon substrate, a silicon compound substrate, or a laminate substrate of silicon and a silicon compound.

Further, it is preferable that the film thickness of each of the first Pb-containing perovskite oxide film and the second Pb-containing perovskite oxide film is 3.5 μm or less.

In the method of producing a laminated thin film structure of the present invention, it is preferable that the second lamination step is performed by forming the second Pb-containing perovskite oxide film under a condition that the difference $|R_{A1}-R_{B1}|$ is 0.019 or greater and more preferable that the second Pb-containing perovskite oxide film is formed under a condition that the difference $|R_{A1}-R_{B1}|$ is in a range of 0.019 to 0.039. It is preferable that the molar ratio $R_{A1}$ is 1.05 or greater.

In the method of producing a laminated thin film structure and the laminated thin film structure of the present invention, it is preferable that a difference in thermal expansion coefficient between the diaphragm and the first Pb-containing perovskite oxide film or the second Pb-containing perovskite oxide film is 5.6 ppm or greater.

It is preferable that the second lamination step is performed under a condition that the second Pb-containing perovskite oxide film is formed at a temperature higher than the film forming temperature of the first lamination step.

It is preferable that the first Pb-containing perovskite oxide film and the second. Pb-containing perovskite oxide film are formed by a vapor growth method and more preferable that both films are formed by a sputtering method.

According to the present invention, there is provided a piezoelectric element comprising: a laminated thin film structure which is produced by the method of producing a laminated thin film structure of the present invention; a first upper electrode which is disposed so as to face the first lower electrode film by interposing the first Pb-containing perovskite oxide film therebetween; and a second upper electrode which is disposed so as to face the second lower electrode film by interposing the second Pb-containing perovskite oxide film therebetween.

Further, according to the present invention, there is provided a piezoelectric element comprising: the laminated thin film structure of the present invention; a first upper electrode which is disposed so as to face the first lower electrode film by interposing the first Pb-containing perovskite oxide film therebetween; and a second upper electrode which is disposed so as to face the second lower electrode film by interposing the second Pb-containing perovskite oxide film therebetween.

According to the method of producing a laminated thin film structure of the present invention, at the time of production of a laminated thin film structure which is formed to sequentially include each lower electrode film; and each Pb-containing perovskite oxide film which has a larger thermal expansion coefficient than that of the diaphragm and is a columnar structure on a front surface and a rear surface of a diaphragm by sequentially performing a first lamination step of laminating the first Pb-containing perovskite oxide film on a front surface of one lower electrode film through direct formation and a second lamination step of laminating the second Pb-containing perovskite oxide film on a front surface of the other lower electrode film through direct formation; the second lamination step is performed by forming the second Pb-containing perovskite oxide film under a condition that a difference $|R_{A1}-R_{B1}|$ between a molar ratio $R_{A1}$ of Pb to a B-site element in the first Pb-containing perovskite oxide film and a molar ratio $R_{B1}$ of Pb to a B-site element in the second Pb-containing perovskite oxide film after the second lamination step is 0.056 or less. According to such a production method, even in a case where a diaphragm having a smaller thermal expansion coefficient than that of the Pb-containing perovskite oxide film is used, it is possible to produce a laminated thin film structure without occurrence of cracks in the Pb-containing perovskite oxide film.

DESCRIPTION OF THE PREFERRED EMBODIMENTS

Figure 1:
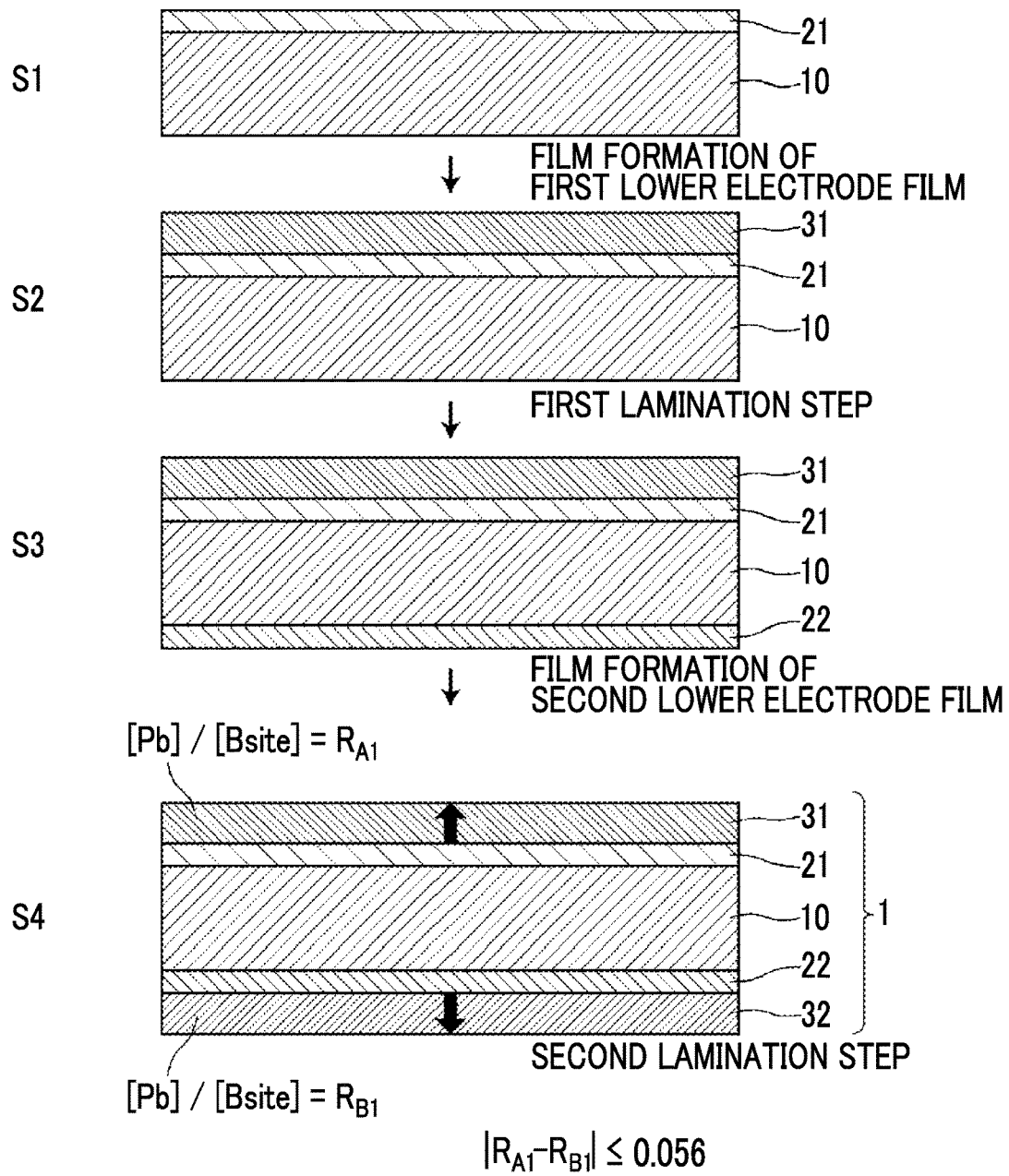
FIG. 1 is a configurational cross-sectional view illustrating a laminated thin film structure and a piezoelectric element according to an embodiment of the present invention.

The present inventors found that, in a case where a laminated thin film structure is obtained by sequentially forming a Pb-containing perovskite oxide film having a columnar stricture on each of both surfaces of a diaphragm having a smaller thermal expansion coefficient than that of a Pb-containing perovskite oxide film such as a Si substrate, there is a problem in that cracks occur due to strong tensile stress generated in a Pb-containing perovskite oxide film formed later (hereinafter, also referred to as a second Pb-containing perovskite oxide film or a second Pb-containing film) during a slow cooling process performed on the second Pb-containing film, and thus the present inventors conducted intensive research on the solutions for this problem.

In a case where a diaphragm having a smaller thermal expansion coefficient than that of a Pb-containing perovskite oxide film, such as a silicon substrate which is mainly used as a substrate of a MEMS device, is used, tensile stress is generated in the Pb-containing perovskite oxide film due to a difference in thermal expansion coefficient between the Pb-containing perovskite oxide film and the diaphragm during a slow cooling process performed after film formation at a high temperature in a level required for the film formation of a columnar structure film. Further, in a case where the Pb-containing perovskite oxide film is formed on only one side of the diaphragm, warpage occurs in the diaphragm as a result of the tensile stress described above.

In a case where Pb-containing perovskite oxide films are formed on the front and rear surfaces of the diaphragm and the forces of the films on the front and rear surfaces to contract are approximately the same as each other, the forces of the films on the front and rear surfaces are balanced and warpage does not occur in a laminated thin film structure formed during the slow cooling process. However, the force of the Pb-containing perovskite oxide film formed earlier (hereinafter, also referred to as a first Pb-containing perovskite oxide film or a first Pb-containing film) to contract during the slow cooling process is considered to generate tensile stress in the second Pb-containing film.

In a laminated thin film structure obtained by forming a Pb-containing perovskite oxide film that has a columnar structure represented by Formula P1 directly on both surfaces of a diaphragm including an electrode layer on a front surface, the tensile stress generated in the second Pb-containing film is correlated with the film thickness of the Pb-containing film, the difference in thermal expansion coefficient between the diaphragm and the Pb-containing film, the Young's moduli of the diaphragm and the Pb-containing film, and a difference in internal stress of the Pb-containing films formed on the front and rear surfaces. For example, the stiffness of the diaphragm is sufficiently greater than that of the Pb-containing film, the difference in thermal expansion coefficient, the Young's modulus of the Pb-containing film, and the film thickness of the Pb-containing film are proportional to the tensile stress generated in the Pb-containing film due to only a pure difference in thermal expansion coefficient. In addition, in a case where a difference in internal stress is generated in the Pb-containing films on the front and rear surfaces of the diaphragm, the diaphragm is warped so that additional compressive stress is generated in one of the Pb-containing films on the front and rear surfaces and additional tensile stress is generated in the other Pb-containing film. The magnitudes of these additional stresses are considered to be correlated with the film thickness of the Pb-containing film and the magnitude of the internal stress. That is, in a case where Pb-containing films having generally the same thermal expansion coefficient are formed on the front and rear surfaces of the diaphragm, the balance between the internal stresses of the Pb-containing films is extremely important for controlling the internal stresses of both Pb-containing films. The magnitude of the internal stress is related to various factors such as the internal structure of a film, the composition of a film, and the adhesiveness of a substrate to a film. The present inventors discovered that Pb volatilization after film formation is the most important parameter for forming the above-described laminated thin film structure among these factors described above.

The present inventors confirmed that the amount of Pb in the first Pb-containing film is smaller than the amount of Pb in the second Pb-containing film as the result of composition analysis performed on the first and second Pb-containing perovskite oxide films which are formed under the same conditions using targets having the same composition. Pb is easily volatilized under high-temperature exposure and easily released from the crystal lattice. Since a perovskite oxide film in which Pb is deficient has a strong force to contract due to the presence of the deficient portion compared to a film in which Pb is not deficient, this strong force is considered to be a factor of generation of strong tensile stress in an oxide film present on the opposite side of the film with the Pb deficient portion through the diaphragm and occurrence of cracks. Further, it has been known that the Pb-containing perovskite oxide film having a columnar structure can be formed by a sol-gel method and a sputtering method and the film forming temperature is required to be in a range of approximately 500° C. to 600° C.

Therefore, the present inventors conceived that the balance between forces of the first PB-containing film and the second Pb-containing film to contract during the slow cooling process after the film formation of the second Pb-containing film is maintained by forming the second Pb-containing film so as to have a composition obtained by subtracting the amount of Pb released from the first Pb-containing film at the time of film formation of the second Pb-containing film at a high temperature, thereby completing the present invention.

In other words, there is provided a method of producing a laminated thin film structure which is formed to sequentially include, on a front surface of a diaphragm, a first lower electrode film and a first Pb-containing perovskite oxide film which has a larger thermal expansion coefficient than that of the diaphragm and is a columnar structure film extending in a film thickness direction from the front surface of the diaphragm and to sequentially include, on a rear surface of the diaphragm, a second lower electrode film and a second Pb-containing perovskite oxide film which is the columnar structure film and has the same film thickness as that of the first Pb-containing perovskite oxide film, the method sequentially including: a first lamination step of laminating the first Pb-containing perovskite oxide film on a front surface of the first lower electrode film through direct formation; and a second lamination step of laminating the second Pb-containing perovskite oxide film on a front surface of the second lower electrode film through direct formation, in which the second lamination step is performed by forming the second Pb-containing perovskite oxide film under a condition that a difference $|R_{A1}-R_{B1}|$ between a molar ratio $R_{A1}$ of Pb to a B-site element in the first Pb-containing perovskite oxide film and a molar ratio $R_{B1}$ of Pb to a B-site element in the second Pb-containing perovskite oxide film after the second lamination step is 0.056 or less, and the first Pb-containing perovskite oxide film and the second Pb-containing perovskite oxide film include one or two or more kinds of perovskite oxides which are formed of the same constituent elements and represented by Formula P1.

P1:

(A represents an A-site element containing at least one element selected from the group consisting of Pb, Ba, Sr, Bi, Li, Na, Ca, Cd, Mg, K, and a lanthanide element, B represents a B-site element containing at least one element selected from the group consisting of Ti, Zr, V, Nb, Ta, Sb, Cr, Mo, W, Mn, Mg, Sc, Co, Cu, In, Sn, Ga, Zn, Cd, Fe, Ni, Hf, and Al, and x satisfies a relationship of "0<x<a".)

FIG. 1 is a view illustrating an example of a production step according to a method of producing a laminated thin film structure of the present invention in a flow of schematic views. In the example illustrated in FIG. 1, a first lower electrode film 21 is formed (S1) on a front surface of a diaphragm 10, a first Pb-containing perovskite oxide film 31 is laminated (S2, a first lamination step) on the first lower electrode film 21 through direct film formation, a second lower electrode film 22 is formed (S3) on a rear surface of the diaphragm 10, and then a second Pb-containing perovskite oxide film 32 is laminated (S4, a second lamination step) on the second lower electrode film 22 through direct film formation to obtain a laminated thin film structure 1. During the second lamination step, the second Pb-containing perovskite oxide film is formed under a condition that a difference $|R_{A1}-R_{B1}|$ between a molar ratio $R_{A1}$ and a molar ratio $R_{B1}$ after the second lamination step is 0.056 or less. Therefore, the laminated thin film structure produced by the method of producing a laminated thin film structure of the present invention, the difference $R_{A1}-R_{B1}|$ between the molar ratio $R_{A1}$ of Pb to a B-site element in the first Pb-containing perovskite oxide film 31 and the molar ratio $R_{B1}$ of Pb to a B-site element in the second Pb-containing perovskite oxide film 32 is 0.056 or less (see S4 of FIG. 1).

The arrows (the same applies to FIGS. 2, 3A, 3B, and 4B) in the Pb-containing perovskite oxide films shown in S4 of FIG. 1 indicate the orientations of the spontaneous polarization axes. In a case where the first and second lamination steps in the method of producing a laminated thin film structure of the present invention are performed according to a sputtering method, the spontaneous polarization axes in the first and second Pb-containing perovskite oxide films (columnar structure films) can be preferentially oriented to (100) in orientations different from each other in a state (asdepo state, as-deposited) immediately after film formation. There are various opinions on the reason why the polarization is aligned immediately after the film formation, but the influence of stress distribution on the Pb-containing perovskite oxide films and the influence of the presence of defects in the Pb-containing perovskite oxide films and the interface between the lower electrode and the upper electrode are considered as the reason.

Even in a case where the first and second Pb-containing perovskite oxide films are formed according to a film forming method other than the sputtering method, it is preferable that these polarization directions are different from each other, the polarization directions may be opposite to the directions illustrated in the figure and are not limited to a relationship of being parallel with each other and being opposite to each other. The polarization directions of respective layers may be not parallel and may be, for example, orthogonal to each other. The polarization direction is defined by a vector direction (from the negative orientation to the positive orientation) of a dipole moment due to uneven charge distribution. In a case where the polarization direction coincides with the electric field application direction in a piezoelectric film, expansion and contraction accompanied by increase and decrease of the electric field application strength effectively occur and a piezoelectric effect due to electric-field-induced strain is effectively obtained.

In order to obtain a desired polarization state, a polarization treatment may be performed using a method of applying a voltage to a space between counter electrodes interposing the first and second Pb-containing perovskite oxide films. The polarization treatment may be accompanied by heating. Further, a corona method or the like may be employed as a method for the polarization treatment. In a case where the polarization state during the film formation can be used as it is, for example, in a case where film formation is performed according to the sputtering method, the polarization treatment can be omitted.

In the present specification, the film thickness of each layer or ratios of the layers illustrated in other figures in FIG. 1 are shown by appropriately changing the scale of each portion in order to facilitate visual recognition. Further, in the present specification, a direction separated from the front surface (or the rear surface) of the diaphragm 10 in the thickness direction is expressed as "upside" in expressing the laminated structure.

Figure 2:
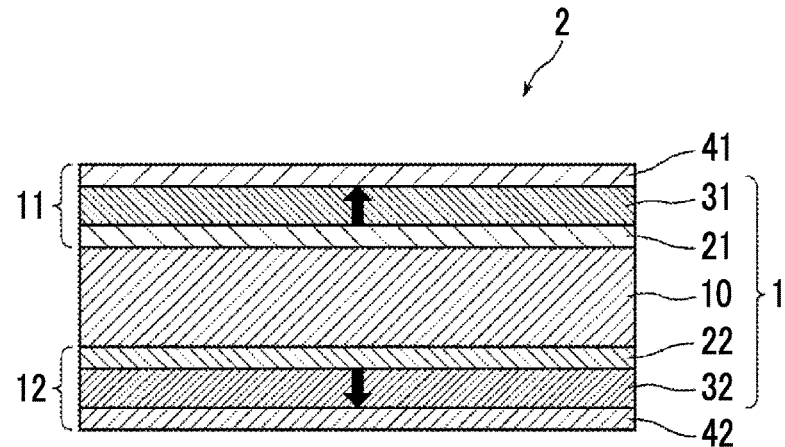
FIG. 2 is a cross-sectional view schematically illustrating a step of producing a laminated thin film structure of the present invention.
Figure 3A:
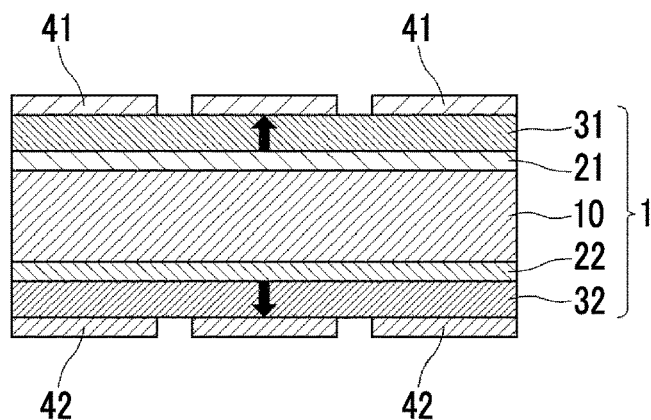
FIG. 3A is a cross-sectional view schematically illustrating a step of producing a cantilever beam sample of the present invention (part 1).
Figure 3B:
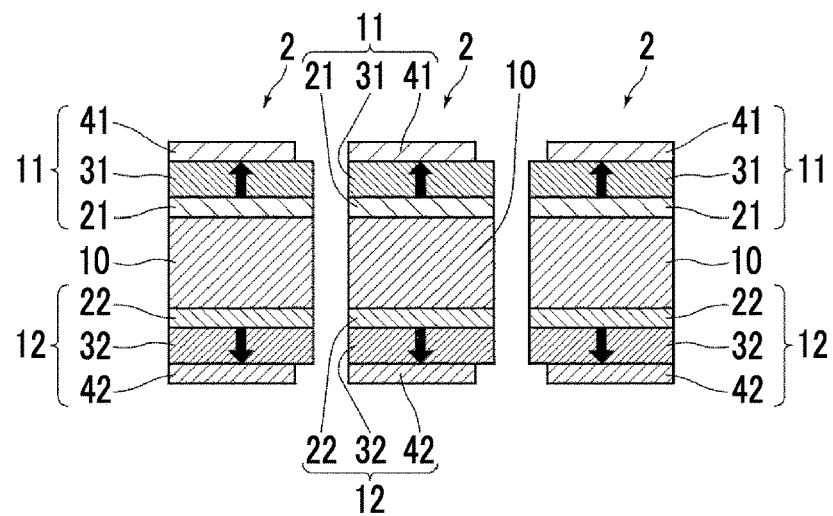
FIG. 3B is a cross-sectional view schematically illustrating a step of producing a cantilever beam sample of the present invention (part 2).

By the laminated thin film structure 1 including first and second upper electrodes (41, 42) which respectively apply a voltage to the first and second Pb-containing perovskite oxide films (31, 32) by being paired with respective lower electrode films (21, 22), it is possible to obtain a bimorph piezoelectric element 2 illustrated in FIG. 2.

The diaphragm 10 is not particularly limited as long as the diaphragm is a substrate having a smaller thermal expansion coefficient than those of the first and second Pb-containing perovskite oxide films, and various substrates such as silicon (Si), quartz, glass, and ceramic can be used. Specific examples thereof include substrates such as silicon, silicon oxide, alumina, sapphire, and SiC; and laminated substrates such as a SOI substrate formed by sequentially laminating a $SiO_2$ film (silicon compound) and a Si active layer on a silicon substrate.

From the viewpoint of applications for MEMS devices, a silicon compound substrate such as a silicon substrate, silicon oxide, or SiC; or a laminate substrate of silicon and a silicon compound is preferable as the diaphragm 10. Since a microstructure can be easily produced using a semiconductor microfabrication technology in a case where a silicon substrate is used as the diaphragm 10, MEMS devices formed by using a piezoelectric film can be collectively formed at a low cost, which is preferable. As described in the examples below, the thermal expansion coefficient of lead zirconate titanate is approximately 8.0 ppm/° C., the thermal expansion coefficient of a Si substrate is 2.4 ppm/° C., and the thermal expansion coefficient of a quartz substrate is 0.5 ppm/° C. The examples below described that a problem of mixture of cracks due to the tensile stress to the Pb-containing film caused by a difference in thermal expansion coefficient is present and the mixture of cracks can be suppressed by the present invention in a case where a difference in thermal expansion coefficient between the diaphragm and the Pb-containing film is 5.6 ppm/° C. or greater.

The diaphragm does not need to be flat and a stepped diaphragm obtained by a thick portion serving as a fixed portion and a thin portion serving as a vibrating portion being integrally formed. By using such a diaphragm, the stiffness of the vibrating portion can be decreased while increasing the stiffness of the fixed portion, and a large displacement amount can be output.

The first lower electrode film 21 and the second lower electrode film 22 are not particularly limited, and examples thereof include platinum (Pt), aluminum (Al), molybdenum (Mo), titanium nitride (TiN), ruthenium (Ru), gold (Au), and silver (Ag). Further, a configuration containing platinum group metals is preferable. Before the first lower electrode film 21 and the second lower electrode film 22 are formed, an adhesive layer such as Ti or TiW may be provided on the diaphragm 10 in order to improve the adhesiveness between the diaphragm 10 and the first lower electrode film 21 or the second lower electrode film 22.

The thickness of the first lower electrode film 21 or the second lower electrode film 22 is not particularly limited and is preferably in a range of 50 to 500 nm. In a case where the first lower electrode film 21 and the second lower electrode film 22 are extremely thick, since electrodes may have stiffness and limit the displacement of the piezoelectric film, the thickness thereof is more preferably in a range of 50 to 300 nm.

The method of forming the first lower electrode film 21 and the second lower electrode film 22 is not particularly limited, and examples thereof include vapor growth methods using plasma such as a sputtering method, an ion beam sputtering method, an ion plating method, and a plasma CVD method.

The first Pb-containing perovskite oxide film 31 is directly formed on the first lower electrode film 21 in the first lamination step and the second Pb-containing perovskite oxide film 32 is directly formed on the second lower electrode film 22 in the second lamination step.

In the first lamination step and the second lamination step, the film forming method is not particularly limited as long as a columnar structure film can be formed. A columnar structure film of a Pb-containing perovskite oxide can be formed by a film forming method of performing crystallization during the film formation at a substrate temperature of 300° C. or higher. As the film forming method, a vapor growth method such as a sputtering method or a sol-gel method is preferable. In these film forming methods, as a film formation condition that enables film formation of a Pb-containing perovskite oxide film having a columnar structure, known film forming conditions in addition to the conditions described in the example below can be appropriately used.

As described above, the condition for forming the Pb-containing perovskite oxide film in the first lamination step is different from the condition for forming the Pb-containing perovskite oxide film in the second lamination step. In the second lamination step, the second Pb-containing perovskite oxide film is formed under the condition that the difference $|R_{A1}-R_{B1}|$ of the molar ratio $R_{A1}$ to the molar ratio $R_{B1}$ after the second lamination step is 0.056 or less. Conventionally, there is no example in which the second Pb-containing film is actively formed to have a composition obtained by subtracting the amount of Pb released from the first Pb-containing film by considering the amount of released Pb in the film formation of the second Pb-containing film. In this manner, the balance between the forces of the first Pb-containing film and the second Pb-containing film to contract is maintained in the slow cooling process after the film formation of the second Pb-containing film, the warpage (initial deflection) is suppressed, and thus a laminated thin film structure free from cracks in the Pb-containing films can be obtained.

In order to set the difference $|R_{A1}-R_{B1}|$ of the molar ratio $R_{A1}$ to the molar ratio $R_{B1}$ after the second lamination step to be lower than or equal to a predetermined value, it is necessary that the second lamination step is performed under a condition that the amount of Pb in the second Pb-containing perovskite oxide film becomes smaller than the amount of Pb in the first Pb-containing perovskite oxide film. In order to decrease the amount of Pb in a film, the content of Pb in the target using a sputtering method or the content of Pb in the raw material liquid using a liquid phase method may be reduced or the film formation may be performed under the condition that highly volatile Pb during the film formation is released from the formed film.

The condition for Pb to be easily released during the film formation may be appropriately set according to the film forming method. For example, a sputtering method may be carried out under a condition for actively inducing an inversed sputtering phenomenon, and specific examples thereof include a method of increasing the substrate temperature and a method of increasing the plasma energy. Further, in a sol-gel method, it is possible to induce Pb to be released by heating the gel so that the heating temperature during the final oxide formation is set to be high. It is preferable that the second lamination step is performed by forming the second Pb-containing perovskite oxide film at a temperature higher than the film forming temperature during the first lamination step.

The adjustment width of the above-described conditions is set such that the difference $|R_{A1}-R_{B1}|$ between the molar ratio $R_{A1}$ to the molar ratio $R_{B1}$ after the second lamination step is 0.056 or less, and it is considered that setting the difference $|R_{A1}-R_{B1}|$ to be 0 is most preferable. However, it is preferable to minimize the adverse effect on physical properties such as degradation in crystallinity due to the mixture of a different phase into a columnar structure film by setting the film forming condition that Pb is easily released from the film during the film formation. As described in the examples below, the production of a laminated thin film structure under the condition that $|R_{A1}-R_{B1}|$ is 0.019 in the second lamination step is succeeded by the present inventors.

In a case where the difference $|R_{A1}-R_{B1}|$ is 0.056 or less, a laminated thin film structure free from cracks, in which warpage is suppressed, is obtained. Further, it has been found that a laminated thin film structure having excellent flatness and free from cracks can be obtained and cracks caused by a processing process accompanied by immersion in a solvent or the like or a heat treatment and stress generated due to application of a drive voltage are also prevented by setting the difference $|R_{A1}-R_{B1}|$ to 0.039 or less (see the examples below) These cracks can be also prevented by optimizing the type of solvent used for the processing process or the heating condition and dealing with the low voltage driving, but each causes an increase in process cost and degradation of actuator performance. In other words, it is possible to realize improvement in the process tolerance of the Pb-containing film, reduction in process cost, and improvement in actuator performance by setting the difference $|R_{A1}-R_{B1}|$ to 0.039 or less. The details for the reason why cracks caused by the stress generated due to application of a drive voltage are correlated with the difference $|R_{A1}-R_{B1}|$ are unknown yet, but it is considered that the balance between the stresses of the Pb-containing thin films on both surfaces and symmetry of drive are contributed to the correlation.

It is preferable that the first Pb-containing perovskite oxide film and the second Pb-containing perovskite oxide film are formed of the same constituent elements within the range that satisfies the relationship between $R_{A1}$ and $R_{B1}$. Since the method of producing a laminated thin film structure of the present invention is a method of producing a laminated thin film structure without warpage of the structure which is caused by the difference in thermal expansion coefficient, the first Pb-containing perovskite oxide film and the second Pb-containing perovskite oxide film may contain elements different from each other within the range that the difference in thermal expansion coefficient between oxide films is ±2.5×ppm/° C. For example, between the first Pb-containing perovskite oxide film 31 and the second Pb-containing perovskite oxide film 32, one piezoelectric film is formed of a lead zirconate titanate (PZT) doped with niobium (Nb) and the other piezoelectric film may be formed of PZT which is not doped with Nb.

From the viewpoint of piezoelectric characteristics, the molar ratio $R_{A1}$ of the first Pb-containing perovskite oxide film in the laminated thin film structure 1 is preferably 1.05 or greater.

As described above, the first and second Pb-containing perovskite oxide films include one or two or more kinds of perovskite oxides (may include unavoidable impurities) represented by Formula P1, it is preferable that the first and second. Pb-containing perovskite oxide films include one or two or more kinds of perovskite oxides represented by Formula P2 (may include unavoidable impurities), and it is more preferable that, in Formula. P2. M includes Nb and the molar ratio (Nb/(Zr+Ti+M)) of Nb to the B site is in a range of 0.10 to 0.20. It is still more preferable that M represents Nb. In Formulae P1 and P2, since a molar ratio a:b:c of the A-site elements, the B-site elements, and oxygen is a ratio of perovskite oxides, the standard value thereof is 1:1:3, but the ratio may be deviated from the standard value within the range that perovskite crystal structures are included.

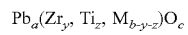

P2:

(M represents at least one B-site element selected from the group consisting of V, Nb, Ta, Sb, Cr, Mo, W, Mn, Mg, Sc, Co, Cu, In, Sn, Ga, Zn, Cd, Fe, Ni, Hf, and Al, y is greater than 0 and less than b, z is greater than 0 and less than b, and b−y−z is greater than or equal to 0.)

Examples of the perovskite oxide represented by Formula P1 include lead titanate, lead zirconate titanate (PZT), lead zirconate, lead titanate lanthanum, lead lanthanum zirconate titanate, magnesium niobate zirconium titanate, nickel niobate zirconium titanate, zinc niobate zirconium titanate, and mixed crystal systems of these.

Since a piezoelectric film formed of a perovskite oxide represented by Formula (P2), particularly, a piezoelectric film in which M of Formula (P2) is Nb and which has a composition close to the composition of a morphotropic phase boundary (MPB) has a high piezoelectric strain constant ($d_{31}$ constant), in a case where a bimorph actuator is obtained, the displacement characteristics thereof are excellent. Further, a piezoelectric actuator including a piezoelectric film formed of a perovskite oxide having such a composition has voltage-displacement characteristics which are excellent in linearity in a drive voltage range.

The crystal structures of the first and second Pb-containing perovskite oxide films 31 and 32 are not particularly limited, and examples of a PZT system formed of a perovskite oxide represented by Formula P2 include a tetragonal system, a rhombohedral system, and a mixed crystal system of these. For example, in a case of PZT having the MPB composition described above, a tetragonal monocrystal structure, a mixed crystal structure of a tetragonal crystal and a rhombohedral crystal, or a rhombohedral single crystal structure is obtained depending on the film forming conditions.

In the laminated thin film structure 1, the film thickness of the first Pb-containing perovskite oxide film and the film thickness of the second Pb-containing perovskite oxide film are the same as each other, including the allowable errors described above, from the viewpoint that the stress generated due to a difference in thermal expansion coefficient is proportional to the film thickness. The product of the stress value and the thickness is a general indicator independent of a material. Further, in a case where the film thickness of the first Pb-containing perovskite oxide film is set to be the same as the film thickness of the second Pb-containing perovskite oxide film, there are advantages that the conditions for etching processing become the same so that the processing is easily performed and the drive waveforms to be applied to piezoelectric films on both surfaces at the time of driving as a piezoelectric element can be made identical.

The film thickness of each of the first Pb-containing perovskite oxide film and the second Pb-containing perovskite oxide film is preferably 3.5 μm or less from the viewpoints of ease of occurrence of cracks and the film formation time (cost).

As described above, according to the method of producing a laminated thin film structure of the present invention, it is possible to produce a laminated thin film structure free from cracks in a Pb-containing perovskite oxide film even in a case where a diaphragm having a smaller thermal expansion coefficient than that of the Pb-containing perovskite oxide film is used.

EXAMPLES

The present invention will be described with reference to examples and comparative examples.

Examples and Comparative Examples

A Si substrate having a thickness of 200 μm was prepared, a Ti dense layer (film thickness of 30 nm) and then an Ir lower electrode film (first lower electrode film, film thickness of 150 nm) were formed on the front surface of the Si substrate at a substrate temperature of 350° C. according to a sputtering method. Next, a first Pb-containing perovskite oxide film having a film thickness listed in Table 1 and formed of intrinsic PZT or Nb-doped PZT (hereinafter, also referred to as Nb-PZT) was formed on the first lower electrode film according to a Rf sputtering method under conditions of a substrate temperature listed in Table 1, a vacuum degree of 0.5 Pa, and a rf power density of 4.4 W/cm$^2$ in an Ar/O$_2$ mixed atmosphere (O$_2$ volume fraction of 6.5%). The compositions of targets (120 φ) used for film formation of the first Pb-containing perovskite oxide film were set as (1) $Pb_{1.3}(Zr_{0.52},Ti_{0.48})O_3$ in a case of Examples 1 and 7 and Comparative Example 1; (2) $Pb_{1.3}((Zr_{0.52},Ti_{0.48})_{0.90},Nb_{0.10})O_3$ in a case of Examples 2 and 8 and Comparative Example 2; (3) $Pb_{1.3}((Zr_{0.52},Ti_{0.48})_{0.88},Nb_{0.12})O_3$ in a case of Examples 3 to 5, 9 and 10, and Comparative Examples 3 to 5; and (4) $Pb_{1.3}((Zr_{0.52},Ti_{0.48})_{0.80},Nb_{0.20})O_3$ in a case of Examples 6 and 11. In the Nb compositions in the films in a case of using these targets, it is calculated that the proportions of Nb in the B site of the perovskite structure are respectively (1) 0%, (2) 10%, (3) 12%, and (4) 20%.

Further, a Nb-doped PZT film was formed in the same manner as in Example 10 except that a quartz substrate having a thickness of 600 μm was used.

Next, similarly, a Ti adhesive layer and an it lower electrode film (second lower electrode film) were formed on the rear surface of the Si substrate including the first Pb-containing perovskite oxide film on the front surface thereof, and then the second Pb-containing perovskite oxide film was formed on the second lower electrode film according to a Rf sputtering method. In the film formation of the second Pb-containing perovskite oxide film, the conditions other than the substrate temperature were the same as those for the first Pb-containing perovskite oxide film (Table 1). Further, the thermal expansion coefficients of the first and second Pb-containing films listed in Table 1 were approximately 8.0 ppm/° C., the thermal expansion coefficient of the Si substrate was 2.4 ppm/° C., and the thermal expansion coefficient of the quartz substrate was 0.5 ppm/° C. The thermal expansion coefficients of the Pb-containing films of the examples and the comparative examples slightly vary depending on the Nb concentration, but the error is negligible in the range that the molar ratio of Nb in B-site elements is 0.000 to 0.200.

Figure 4A:
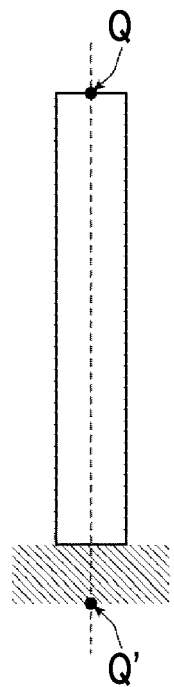
FIG. 4A is a top view illustrating a cantilever beam sample according to an example and a comparative example.
Figure 4B:
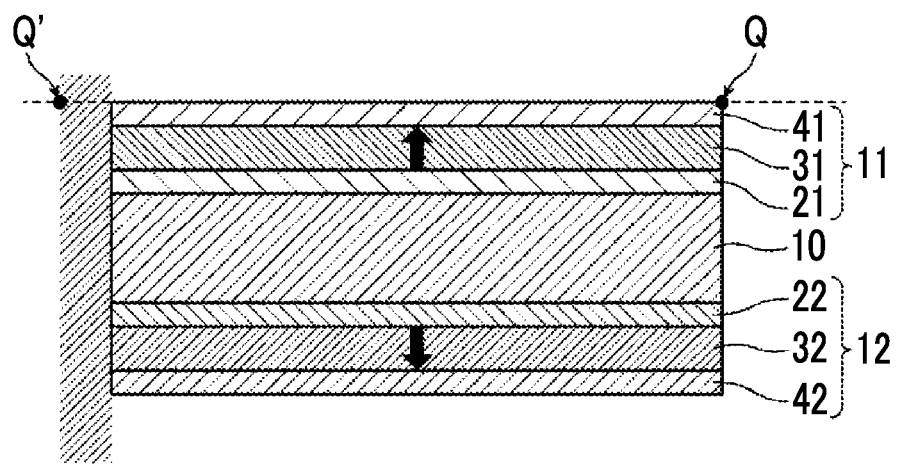
FIG. 4B is a cross-sectional view taken along line Q-Q' of the cantilever beam sample of FIG. 4A.
Figure 5A:
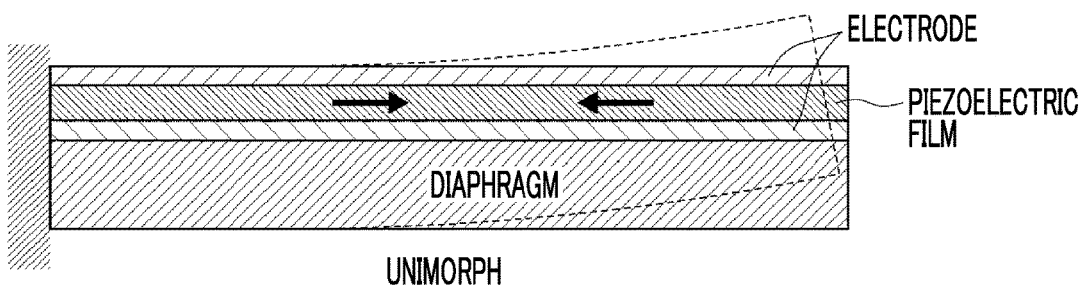
FIG. 5A is a view schematically illustrating an operation of a unimorph actuator and the orientation of stress applied to a piezoelectric thin film.
Figure 5B:
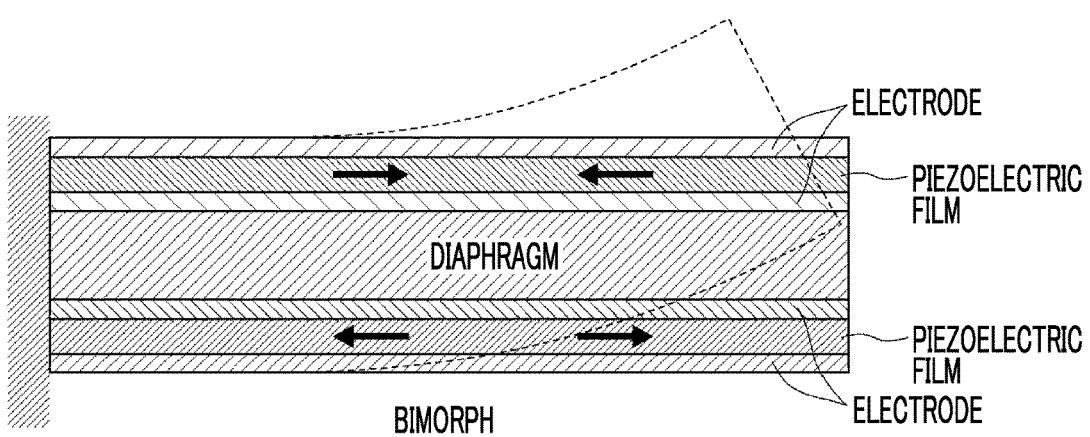
FIG. 5B is a view schematically illustrating an operation of a bimorph actuator and the direction of stress applied to a piezoelectric thin film.

In order to evaluate the piezoelectric characteristics of the piezoelectric films (first and second Pb-containing perovskite oxide films) formed on the front and rear surfaces of the diaphragm in the above-described manner, Ir upper electrodes (first and second upper electrodes) having a thickness of 80 nm were pattern-formed (FIG. 3A) on both surfaces according to a lift-off method, three piezoelectric elements for measurement were prepared by performing a dicing process (FIG. 3B), and then a device having a cantilever beam structure with the configurations of FIG. 4A (top view) and FIG. 4B (cross-sectional view taken along line Q-Q' of FIG. 4M was prepared. The width of the cantilever beam was set to 2 mm and the length thereof was set to approximately 25 mm.

In FIG. 4A, the cantilever beam was a bimorph piezoelectric element that includes a first piezoelectric portion 11 and a second piezoelectric portion 12 on both surfaces of the diaphragm 10, and the evaluation of the piezoelectric characteristics of the piezoelectric elements of each of the piezoelectric films was performed by measuring the displacement of a piezoelectric thin film unimorph actuator vertically deflected and deformed by a voltage being applied to a space between the upper and lower electrodes of each of the piezoelectric films.

Specifically, a sine wave having a peak to peak voltage of 10 V and an offset voltage of 5 V was input to the upper electrode on the side of the first piezoelectric portion 11 or the second piezoelectric portion 12, the displacement speed at the end of the cantilever beam was measured using a laser Doppler vibrometry (LDV), and the displacement amount was calculated from the displacement speed and the driving frequency. The piezoelectric constant $d_{31}$ of the PZT or Nb-doped PZT thin film was determined by comparing the obtained displacement amount with the theoretical value calculated by a finite element method (FEM). Femtet (manufactured by Murata Software Co., Ltd.) was used as the finite element method software. The physical parameters used for the calculation were as listed in Table 2.

(Evaluation Results)
<Crystal Structure>

The crystal structures of the first and second Pb-containing films were investigated by performing X-ray diffraction immediately after the formed second Pb-containing film was slowly cooled. As the result, in all examples and comparative examples, it was confirmed that the first and second Pb-containing films were perovskite single phases and also films in which the (100) surfaces of crystals were preferentially oriented.

<Composition>

Further, the value of Pb/(Zr+Ti+Nb) in the first and second Pb-containing films was investigated by performing X-ray fluorescence analysis (XRF) immediately after the formed second. Pb-containing film was slowly cooled. Further, in all examples and comparative examples, it was confirmed that the ratio Nb/(Zr+Ti+Nb) (the ratio of Nb to the perovskite B site) in the piezoelectric film was approximately the same as the ratio Nb/(Zr+Ti+Nb) in the target by the same measurement. In the examples and the comparative examples, the ratio of Pb/(Zr+Ti+Nb) in the film was controlled by controlling the substrate temperature.

<Polarization Direction>

In a case where intrinsic PZT was used as a piezoelectric film (Examples 1 and 7 and Comparative Example 1), the first Pb-containing film and the second Pb-containing film were in a state in which the polarization directions thereof were random immediately after the film formation and the piezoelectric displacement was extremely small. Therefore, in these first and second Pb-containing films, the polarization treatment was performed before the piezoelectric displacement was measured and the polarization directions were aligned in a specific direction. The polarization treatment was performed by holding the lower electrode in a grounded state, applying a direct current (DC) voltage of −20 V to the upper electrode, and holding the state for 10 minutes.

In addition, in a case where PZT obtained by adding 10% or greater of Nb was used as a piezoelectric film (other than Examples 1 and 7 and Comparative Example 1), the spontaneous polarization directions of the first Pb-containing film and the second Pb-containing film were aligned in the same direction immediately after the film formation so that the polarization treatment was unnecessary. The orientations of spontaneous polarization of the first Pb-containing film and the second Pb-containing film were a direction separated from the front surface of the diaphragm to the film thickness direction.

<Cracks>

After the second Pb-containing film was formed, occurrence of cracks in the second Pb-containing film was confirmed in the steps from the preparation of elements to the driving. The presence of cracks in each step was confirmed using an optical microscope and the evaluation was performed based on the following standard.

A: Cracks did not occur until the evaluation was completed.

B: Cracks occurred due to the evaluation process (lithography process or application of a drive voltage)

C: Cracks occurred during a time period from natural furnace cooling after the film formation to start of the evaluation process.

Further, cracks did not occur in the first Pb-containing film.

The conditions for film formation and the evaluation results of respective examples are listed in Table 1. As listed in Table 1, it was understood that ease of cracking was strongly correlated with the difference $|R_{A1}-R_{B1}|$ of the first Pb-containing film and the second Pb-containing film and occurrence of cracks in the second Pb-containing film during the slow cooling step was able to be prevented by forming the second Pb-containing film such that the difference $|R_{A1}-R_{B1}|$ was set to 0.056 or less. In a case where cracks occurred in the piezoelectric film, vertical conduction occurred in the crack portion during vapor deposition of the upper electrode and the element was not able to be driven. Accordingly, a bimorph piezoelectric element capable of outputting a high displacement using voltage application can be prepared by setting the difference $|R_{A1}-R_{B1}|$ in composition of Pb to 0.056 or less.

Further, by setting the difference $|R_{A1}-R_{B1}|$ to 0.039 or less, a laminated thin film structure which had excellent flatness and excellent durability, was free from cracks, and in which cracks caused by the stress generated due to application of a drive voltage were unlikely to occur was able to be obtained.

<Piezoelectric Characteristics>

In a case where intrinsic PZT was used as a piezoelectric film (Examples 1 and 7 and Comparative Example 1), it was confirmed that the piezoelectric performance of the first Pb-containing film was degraded. It is considered that the piezoelectric characteristics deteriorated due to evaporation and desorption of Pb from the film because the first Pb-containing film was exposed to a high temperature during the film formation of the second Pb-containing film. The deterioration of the piezoelectric characteristics may become a factor of degradation in actuator performance and a difference in piezoelectric characteristics between the piezoelectric films on the front and rear surfaces of the diaphragm is generated. Accordingly, it becomes necessary to tune the drive voltage waveform and an increase in cost may be caused. In addition, in a case where a Pb-containing film obtained by adding 10% or greater of Nb was used as a piezoelectric film, it was possible to suppress degradation of piezoelectric performance of the first Pb-containing film. The details of the factor are not clear, but it is considered that a high-performance region was partially generated due to migration of Nb during the exposure to a high temperature and segregation. From the results described above, it was understood that the piezoelectric characteristics of the first Pb-containing film were able to be highly maintained by using the Pb-containing film obtained by adding 10% or greater of Nb as a piezoelectric body, and thus elements having high piezoelectric performance were able to be realized on both surfaces of the diaphragm.

TABLE 1

| | | First surface | | Second surface | | | Evaluation of cracks | [Nb]/[B site] | PZT film thickness (μm) | | Piezoelectric constant $d_{B1}$ (pm/V) | |
| | | Film forming | | Film forming | | | | | | | | |
| | Substrate | temperature (° C.) | $R_{A1}$([Pb]/[B site]) | temperature (° C.) | $R_{B1}$([Pb]/[B site]) | $|R_{A1} - R_{B1}|$ | Second surface | First surface and second surface | First surface | Second surface | First surface | Second surface |
|---|---|---|---|---|---|---|---|---|---|---|---|---|
| Example 1 | Si | 620 | 1.056 | 650 | 1.082 | 0.026 | A | 0.000 | 3.2 | 3.3 | 85 | 125 |
| Example 2 | Si | 620 | 1.056 | 650 | 1.090 | 0.034 | A | 0.100 | 3.3 | 3.1 | 229 | 231 |
| Example 3 | Si | 615 | 1.061 | 645 | 1.100 | 0.039 | A | 0.120 | 3.2 | 3.2 | 252 | 240 |
| Example 4 | Si | 620 | 1.056 | 650 | 1.081 | 0.025 | A | 0.120 | 3.3 | 3.3 | 255 | 236 |
| Example 5 | Si | 620 | 1.070 | 650 | 1.090 | 0.020 | A | 0.120 | 1.2 | 1.0 | 230 | 225 |
| Example 6 | Si | 615 | 1.061 | 635 | 1.080 | 0.019 | A | 0.200 | 3.3 | 3.5 | 280 | 273 |
| Example 7 | Si | 620 | 1.052 | 640 | 1.100 | 0.048 | B | 0.000 | 3.2 | 3.2 | 89 | 121 |
| Example 8 | Si | 620 | 1.054 | 640 | 1.110 | 0.056 | B | 0.100 | 3.3 | 3.3 | 238 | 231 |
| Example 9 | Si | 620 | 1.056 | 640 | 1.098 | 0.041 | B | 0.120 | 3.3 | 3.3 | 253 | 237 |
| Example 10 | Si | 620 | 1.070 | 640 | 1.100 | 0.040 | B | 0.120 | 1.0 | 1.1 | 230 | 225 |
| Example 11 | Si | 620 | 1.058 | 640 | 1.100 | 0.042 | B | 0.200 | 3.2 | 3.1 | 275 | 270 |
| Example 12 | Quartz | 620 | 1.061 | 640 | 1.117 | 0.056 | B | 0.120 | 3.1 | 3.3 | 255 | 235 |
| Comparative Example 1 | Si | 620 | 1.055 | 620 | 1.160 | 0.105 | C | 0.000 | 3.3 | 3.2 | 92 | 123 |
| Comparative Example 2 | Si | 620 | 1.053 | 620 | 1.160 | 0.107 | C | 0.100 | 2.8 | 3.1 | 235 | 230 |
| Comparative Example 3 | Si | 612 | 1.065 | 612 | 1.166 | 0.100 | C | 0.120 | 3.2 | 3.3 | 243 | 237 |
| Comparative Example 4 | Si | 620 | 1.052 | 620 | 1.158 | 0.106 | C | 0.120 | 3.3 | 3.5 | 247 | 238 |
| Comparative Example 5 | Si | 615 | 1.060 | 615 | 1.127 | 0.068 | C | 0.120 | 3.2 | 3.2 | 240 | 235 |
| Comparative Example 6 | Si | 620 | 1.070 | 620 | 1.150 | 0.080 | C | 0.120 | 1.1 | 1.3 | 221 | 219 |

TABLE 2

| Material | Density (kgm$^{-3}$) | Young's modulus (GPa) | Poisson's ratio |
|---|---|---|---|
| Si | 2330 | 130 | 0.28 |
| Ir | 22560 | 530 | 0.26 |
| PZT | 8000 | 50 | 0.34 |

The piezoelectric element of the present invention can be preferably applied to a piezoelectric actuator or the like to be mounted on inkjet type recording heads, magnetic recording and reproducing heads, micro electro-mechanical systems (MEMS) devices, micro pumps, ultrasound probes, and the like.

EXPLANATION OF REFERENCES

1: laminated thin film structure
2: piezoelectric element
10: diaphragm
11: first piezoelectric portion
12: second piezoelectric portion
21: first lower electrode film
22: second lower electrode film
31: first Pb-containing perovskite oxide film (first Pb-containing film)
32: second Pb-containing perovskite oxide film (second Pb-containing film)
41: first upper electrode
42: second upper electrode

What is claimed is:
1. A laminated thin film structure comprising:
a diaphragm;
a first lower electrode film which is formed on a front surface of the diaphragm;
a first Pb-containing perovskite oxide film which is directly formed on a front surface of the first lower electrode film on the opposite side of the diaphragm and has a larger thermal expansion coefficient than that of the diaphragm;
a second lower electrode film which is formed on a rear surface of the diaphragm; and
a second Pb-containing perovskite oxide film which is directly formed on a front surface of the second lower electrode film on the opposite side of the diaphragm and has the same film thickness as that of the first Pb-containing perovskite oxide film,
wherein a difference $|R_{A1}-R_{B1}|$ between a molar ratio $R_{A1}$ of Pb to a B-site element in the first Pb-containing perovskite oxide film and a molar ratio $R_{B1}$ of Pb to a B-site element in the second Pb-containing perovskite oxide film is in a range of 0.019 to 0.056,
spontaneous polarization axes of the first and second Pb-containing perovskite oxide films are preferentially oriented to (100) in orientations different from each other, and
the first and second Pb-containing perovskite oxide films include one or two or more kinds of perovskite oxides which are formed of the same constituent elements and represented by Formula P1,

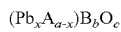
$(Pb_xA_{a-x})B_bO_c$      P1:

in Formula P1, A represents an A-site element containing at least one element selected from the group consisting of Pb, Ba, Sr, Bi, Li, Na, Ca, Cd, Mg, K, and a lanthanide element, B represents a B-site element containing at least one element selected from the group consisting of Ti, Zr, V, Nb, Ta, Sb, Cr, Mo, W, Mn, Mg, Sc, Co, Cu, In, Sn, Ga, Zn, Cd, Fe, Ni, Hf, and Al, and x satisfies a relationship of "0<x<a".

2. The laminated thin film structure according to claim 1, wherein a difference in thermal expansion coefficient between the diaphragm and the first Pb-containing perovskite oxide film or the second Pb-containing perovskite oxide film is 5.6 ppm or greater.

3. The laminated thin film structure according to claim 1, wherein the diaphragm is a silicon substrate, a silicon compound substrate, or a laminate substrate of silicon and a silicon compound.

4. The laminated thin film structure according to claim 1, wherein the Pb-containing perovskite oxide films include one or two or more kinds of perovskite oxides represented by Formula P2, $$Pb_a(Zr_y,Ti_z,M_{b-y-z})O_c \quad \text{P2:}$$

in Formula P2, M represents at least one B-site element selected from the group consisting of V, Nb, Ta, Sb, Cr, Mo, Mn, Mg, Sc, Co, Cu, In, Sn, Ga, Zn, Cd, Fe, Ni, Hf, and Al, y is greater than 0 and less than b, z is greater than 0 and less than b, and b−y−z is greater than or equal to 0.

5. The laminated thin film structure according to claim 4, wherein, in Formula P2, M includes Nb, and
the molar ratio (Nb/(Zr+Ti+M)) of Nb to B site is in a range of 0.10 to 0.20.

6. The laminated thin film structure according to claim 4, wherein, in Formula P2, M represents Nb, and
Nb/(Zr+Ti+Nb) is in a range of 0.10 to 0.20.

7. The laminated thin film structure according to claim 1, wherein the film thickness of each of the first Pb-containing perovskite oxide film and the second Pb-containing perovskite oxide film is 3.5 μm or less.

8. A piezoelectric element comprising:
the laminated thin film structure according to claim 1;
a first upper electrode which is disposed so as to face the first lower electrode film by interposing the first Pb-containing perovskite oxide film therebetween; and
a second upper electrode which is disposed so as to face the second lower electrode film by interposing the second Pb-containing perovskite oxide film therebetween.

* * * * *